US006946741B2

United States Patent
Yamashita

(10) Patent No.: US 6,946,741 B2
(45) Date of Patent: Sep. 20, 2005

(54) SEMICONDUCTOR DEVICE AND MANUFACTURING METHOD THEREOF

(75) Inventor: Soichi Yamashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 10/291,642

(22) Filed: Nov. 12, 2002

(65) Prior Publication Data

US 2004/0043534 A1 Mar. 4, 2004

(30) Foreign Application Priority Data

Aug. 30, 2002 (JP) .......... P2002-252916

(51) Int. Cl.7 .......... H01L 23/48; H01L 23/52; H01L 29/40
(52) U.S. Cl. .......... 257/778; 257/779; 257/780; 438/108; 438/613
(58) Field of Search .......... 257/778, 779, 257/780; 438/108, 613; 228/180.21, 180.22

(56) References Cited

U.S. PATENT DOCUMENTS

| | | | | |
|---|---|---|---|---|
| 5,710,071 A | * | 1/1998 | Beddingfield et al. | 438/108 |
| 6,090,301 A | * | 7/2000 | Mizukoshi et al. | 216/17 |
| 6,300,685 B1 | * | 10/2001 | Hasegawa et al. | 257/780 |
| 6,404,062 B1 | * | 6/2002 | Taniguchi et al. | 257/778 |
| 6,507,098 B1 | * | 1/2003 | Lo et al. | 257/686 |
| 6,770,543 B2 | * | 8/2004 | Nakamura | 438/460 |

FOREIGN PATENT DOCUMENTS

| | | | |
|---|---|---|---|
| JP | A 63-124425 | 5/1988 | |
| JP | 05175361 A | * 7/1993 | .......... H01L/23/28 |
| JP | 2000-003922 | 1/2000 | |
| JP | A 2002-208670 | 7/2002 | |

* cited by examiner

*Primary Examiner*—George Eckert
*Assistant Examiner*—Edgardo Ortiz
(74) *Attorney, Agent, or Firm*—Finnegan, Henderson, Farabow, Garrett & Dunner, L.L.P.

(57) ABSTRACT

A semiconductor device is provided which includes a first semiconductor chip, a substrate onto which the first semiconductor chip is flip-chip bonded and on which a concave is formed along one side of the first semiconductor chip which is flip-chip bonded, a second semiconductor chip which is flip-chip bonded onto a portion on the substrate opposite the first semiconductor chip across the concave on the substrate, and a resin applied to spaces between the substrate and the first and second semiconductor chips.

20 Claims, 7 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2002-252916 filed on Aug. 30, 2002; the entire contents of which are incorporated herein by reference.

BACKGROUND

1. Field of the Invention

The present invention relates to a semiconductor device having a substrate onto which a plurality of semiconductor chips are flip-chip bonded and a manufacturing method thereof, and more particularly, to the semiconductor device and the manufacturing method thereof which are suitable for yield enhancement.

2. Description of the Related Art

In recent years, the downsizing of a semiconductor device itself has been demanded as the downsizing and sophistication of electronic equipment and communications equipment employing the semiconductor device have been in progress. One of the structures to downsize the semiconductor device is the structure to flip-chip bond a plurality of semiconductor chips onto one wiring substrate by narrowing a gap therebetween.

An example of a process for manufacturing such a semiconductor device is shown in FIG. 8A to FIG. 8C, which are side views illustrating a conventional process for manufacturing a semiconductor device.

Firstly, as shown in FIG. 8A, solder bumps 103a and 103b are formed in advance on external connection pads (not shown) on the surfaces of semiconductor chips 102a and 102b, and a sealing resin (an underfill resin) 104 before curing is applied to a flip-chip bonding surface on a wiring substrate 101, for example, by a dispenser. Here, a land (not shown) which is an electric conductor for the flip-chip bonding is formed by patterning on the flip-chip bonding surface of the wiring substrate 101.

Then, the semiconductor chips 102a and 102b and the wiring substrate 101 are kept apart from each other in a direction of z, and the semiconductor chips 102a and 102b are aligned (x position, y position and rotational position around a z axis) relative to the wiring substrate 101.

Next, as shown in FIG. 8B, the semiconductor chips 102a and 102b are moved in a direction closer to the wiring substrate 101 (z direction) to be pressed against the wiring substrate 101, for example, by a flip-chip bonder, and are mounted and arranged so as to bring the solder bumps 103a and 103b into contact with the land on the wiring substrate 101. Through these processes, the semiconductor chips 102a and 102b are temporarily fixed on the wiring substrate 101 with an adhesive force of the sealing resin 104.

At this time, the sealing resin 104 before curing is filled into a space between the semiconductor chip 102a and the wiring substrate 101 and a space between the semiconductor 102b and the substrate 101, and is squeezed out from these spaces to spread over the surface of the wiring substrate 101. It is intended that reliable shield from the atmosphere and mechanical structure having a sufficient strength of the flip-chip bonding portions are obtained owing to these filled portions and squeezed out portions (called fillets).

Next, as shown in FIG. 8C, the wiring substrate 101 on which the semiconductor chips 102a and 102b are temporarily fixed is heated to melt the solder bumps 103a and 103b so that mechanical and electrical connection of the semiconductor chips 102a and 102b with the wiring substrate 101 is established, and the sealing resin 104 is cured.

Here, the narrower gap between the semiconductor chip 102a and the semiconductor 102b is more desirable in terms of downsizing of the semiconductor device. However, it has turned out that the design for narrowing the gap therebetween results in decrease in yield as a semiconductor device. According to the analysis of the causes, it has turned out that a major cause results from the fact that in the step shown in FIG. 8B, the sealing resin 104 which is squeezed out from the spaces between the wiring substrate 101 and the semiconductor chips 102a and 102b and is positioned between the semiconductor chip 102a and the semiconductor chip 102b is folded so that a force to widen the gap between the semiconductor chip 102a and the semiconductor chip 102b is generated to cause the displacement of the semiconductor chip 102a and the semiconductor chip 102b from a predetermined position.

SUMMARY

A semiconductor device according to an aspect of the present invention comprises a first semiconductor chip, a substrate onto which the first semiconductor chip is flip-chip bonded and on which a concave is formed along one side of the first semiconductor chip which is flip-chip bonded, a second semiconductor chip which is flip-chip bonded onto a portion on the substrate opposite the first semiconductor chip across the concave on the substrate, and a resin applied to a space between the substrate and the first semiconductor chip and a space between the substrate and the second semiconductor chip.

A manufacturing method of a semiconductor device according to an aspect of the present invention comprises: forming a concave between a first area and a second area on a substrate surface onto which semiconductor chips are to be flip-chip bonded; supplying a resin to the first and second areas on the substrate surface, evading the concave; and flip-chip bonding the semiconductor chips onto the first and second areas on the substrate surface respectively so as to sandwich the resin between the substrate and the semiconductor chips.

DETAILED DESCRIPTION

Explanation of Embodiments

Figure 1A:
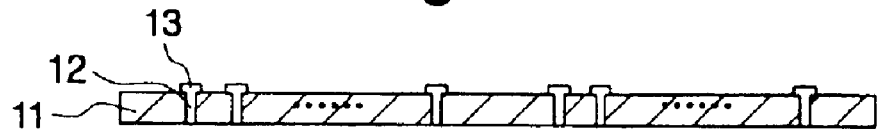
FIG. 1A to FIG. 1E are sectional views schematically showing a manufacturing method of a semiconductor device according to an embodiment of the present invention.

According to an embodiment of a semiconductor device of the present invention, a concave is formed on a substrate in the vicinity of a gap formed by a first semiconductor chip and a second semiconductor chip which are flip-chip bonded onto the substrate. Consequently, a resin squeezed out to this portion also enters the concave to lower an effective resin filling factor. Accordingly, even when the resin is applied on the substrate so as to form required fillets around the sides other than the sides facing each other of the respective semiconductor chips, an excessive amount of the resin is not practically filled into the gap between the semiconductor chips. As a result, the displacement of the semiconductor chips relative to the substrate is greatly reduced so that a semiconductor device having an enhanced yield can be obtained.

According to one of the modes of the embodiment, the concave on the substrate is formed in a groove-like shape along one side (the facing side) of the first semiconductor chip. The groove-like forming can make it easier to ensure a capacity large enough to receive the excessive resin.

According to another mode of the embodiment, the concave on the substrate is formed as a plurality of holes arranged in a line along the aforesaid one side of the first semiconductor chip. The arrangement of the plural holes makes it easier to ensure a wiring area as a substrate.

According to still another mode of the embodiment, a plan form of the concave on the substrate is embraced in an orthogonal projective plane on the substrate by the gap between the first semiconductor chip and the second semiconductor chip which is seen from an upper direction. This structure is employed since it allows required fillets to be formed in portions on the substrate adjacent to the gap between the semiconductor chips.

According to yet another mode of the embodiment, a filling factor of the resin is 60% or lower in a space domain, where a base thereof corresponds to an orthogonal projective plane on the substrate by the gap between the first semiconductor chip and the second semiconductor chip which is seen from an upper direction while a height thereof corresponds to a distance from a surface of the substrate onto which the flip-chip bonding is established to one rear surface being not higher than the other rear surface between rear surfaces of the first semiconductor chip and the second semiconductor chip relative to the substrate. An experiment shows that the filling factor of 60% or lower almost eliminates the displacement of the flip-chip bonding of the semiconductor chips. The presence of the concave facilitates the realization of such a mode.

According to yet another mode of the embodiment, relationship among F, A, and V is expressed as $2F-A \leq 0.6V$, where F represents a volume of a fillet which is formed of the resin applied to the space between the substrate and the first and second semiconductor chips and squeezed out from the space, and which is formed along a side having an equal length to that of the side along the concave, of the first or second semiconductor chip and being opposite to the side along the concave, A represents a capacity of the concave, and V represents a volume of a space domain, where a base thereof corresponds to an orthogonal projective plane on the substrate by the gap between the first semiconductor chip and the second semiconductor chip which is seen from an upper direction while a height thereof corresponds to a distance from a surface of the substrate onto which the aforesaid flip-chip bonding is established to one rear surface being not higher than the other rear surface between rear surfaces of the first semiconductor chip and the second semiconductor chip relative to the substrate. According to yet another mode of the embodiment, relationship among F, Fa, A, and V is expressed as $(F+Fa)-A \leq 0.6V$, where F and Fa represent respectively a volume of fillets which are formed of the resin applied to the space between the substrate and the first and second semiconductor chips and squeezed out from the space, and each of which is formed along a side having an equal length to that of the side along the concave, of each of the first and second semiconductor chips and being opposite to the side along the concave, A represents a capacity of the concave, and V represents a volume of a space domain, where a base thereof corresponds to an orthogonal projective plane on the substrate by a gap between the first semiconductor chip and the second semiconductor chip which is seen from an upper direction while a height thereof corresponds to a distance from a surface of the substrate onto which the flip-chip bonding is established to one rear surface being not higher than the other rear surface between rear surfaces of the first semiconductor chip and the second semiconductor chip relative to the substrate. The fillet having the volume F (Fa) can be formed with a sufficient volume by the additional capacity A. Consequently, reliability is enhanced.

According to yet another mode of the embodiment, relationship between the volume F (Fa) and the volume V is expressed as $2F>0.6V$, or $F+Fa>0.6V$. Such a case is also included in the case where the aforesaid relationship is expressed as $2F-A \leq 0.6V$, or $(F+Fa)-A \leq 0.6V$.

According to yet another mode of the embodiment, the substrate is a semiconductor as a material. The substrate made of the semiconductor is suitable for use in the case where a more microscopic forming of the wiring is required since a semiconductor manufacturing process can be employed for a wiring forming process.

According to yet another mode of the embodiment, the substrate is a resin as a material. The substrate made of the resin is most commonly used and suitable for cost reduction.

According to yet another mode of the embodiment, the substrate has a wiring on/under a base of the concave. The arrangement of the wiring on/under the base makes it possible to dispose wirings connecting the semiconductor chips so that an organic combination of the semiconductor chips to be flip-chip bonded can have versatility to increase an added value as a semiconductor device.

According to yet another mode of the embodiment, the substrate has on a surface thereof a wiring passing between the plural holes arranged in a line. In this example as well, the wirings connecting the semiconductor chips can be provided so that an organic combination between the semiconductor chips to be flip-chip bonded can have versatility to increase an added value as a semiconductor device.

According to yet another mode of the embodiment, the first and second semiconductor chips are flip-chip bonded onto the substrate by using a solder. The use of the solder allows an easier manufacturing of a semiconductor device having flip-chip bonding.

According to yet another mode of the embodiment, the substrate has a vertical electric conductor which establishes electrical connection between a surface onto which the first and second semiconductor chips are flip-chip bonded and a surface opposite this surface, and an external connection terminal which is disposed on this opposite surface and electrically conducting to the electric conductor. Through the use of the external connection terminal provided on the opposite surface, a semiconductor device having terminals which are arranged in high-density distribution such as BGA (ball grid array) and LGA (land grid array) can be obtained.

According to yet another mode of the embodiment, the first semiconductor chip and/or the second semiconductor chip are(is) constituted as a memory chip. It is a typical example as a semiconductor device for which downsizing is required. Both of them can be constituted as memory chips to increase the memory capacity thereof, or either one of them can be constituted as a logistic chip to increase an added value thereof.

Further, according to an embodiment of a manufacturing method of a semiconductor device of the present invention, a concave is formed between a first area and a second area on a substrate surface onto which semiconductor chips are to be flip-chip bonded, a resin is supplied to the substrate surface, evading the formed concave, and a plurality of the semiconductor chips are flip-chip bonded onto the substrate surface so as to sandwich the supplied resin between the substrate and the semiconductor chips.

Even when the resin is squeezes out from spaces between the substrate and the semiconductor chips due to the flip-chip bonding and filled into a gap between the plural semiconductor chips, the resin can be received by this concave since it is formed on the substrate beforehand. Hence, even when the resin is supplied on the substrate so as to form required fillets around the sides other than the sides facing each other of the respective semiconductor chips, an excessive amount of the resin is not practically filled into the gap between the semiconductor chips. As a result, the displacement of the semiconductor chips relative to the substrate is greatly reduced so that a semiconductor device manufacturing method capable of enhancing yield thereof can be provided.

Here, according one of the modes of the embodiment, the concave is formed by using a semiconductor substrate as the aforesaid substrate and etching this semiconductor substrate. The semiconductor substrate etching makes it possible to employ a semiconductor manufacturing process so that the concave can easily be formed.

According to another mode of the embodiment, a linear groove is or a plurality of holes arranged in a line are formed as the aforesaid concave between the first area and the second area on the substrate surface onto which the semiconductor chips are to be flip-chip bonded. Forming the groove makes it easier to secure a capacity large enough to receive an excessive resin. Disposing the plural holes makes it easier to secure a wiring area as a substrate. Namely, the plural holes arranged in a line may be formed such that a wiring disposed on the substrate surface passes between the plural holes.

Based on the above description, an embodiment of the present invention will be hereinafter explained with reference to the drawings. To begin with, the correlation between the resin filling factor in a gap between semiconductor chips mounted adjacent to each other and the mounting displacement of the semiconductor chips will be described.

Figure 7A:
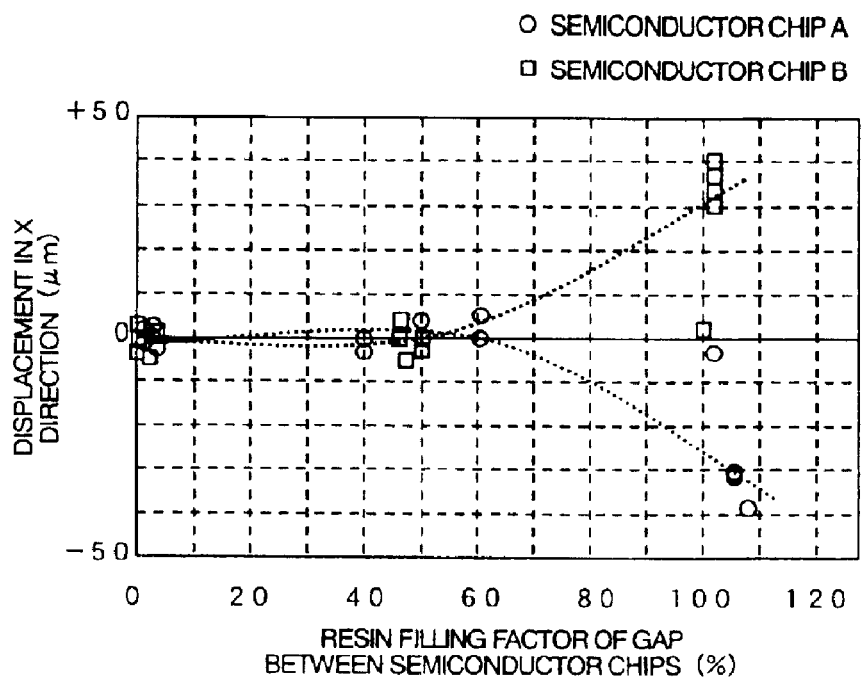
FIG. 7A and FIG. 7B are graphs showing the measured results of the mounting displacement of the semiconductor chips when the resin filling factor in the gap between the semiconductor chips mounted adjacent to each other is varied.
Figure 7B:
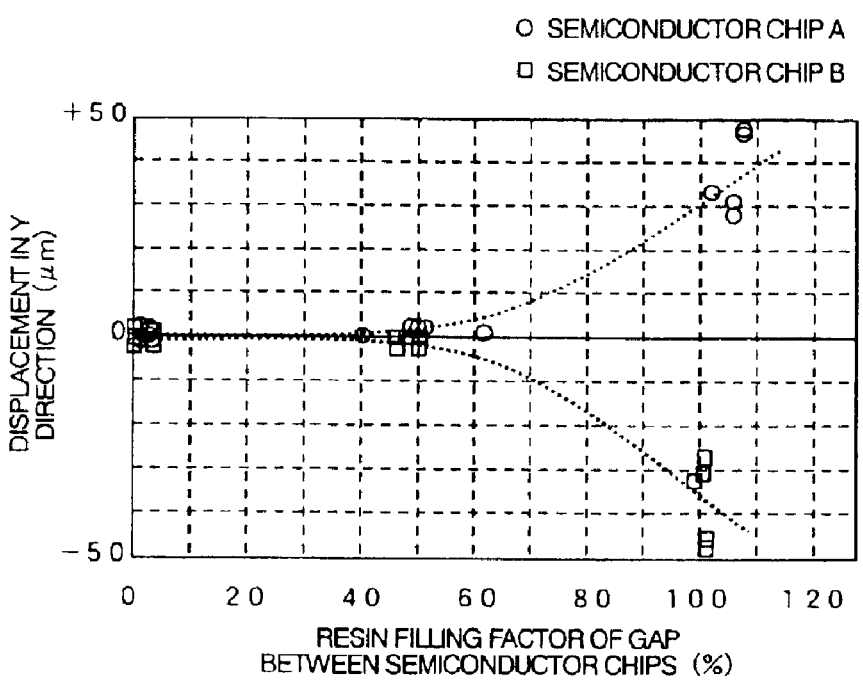
Figure 8A:
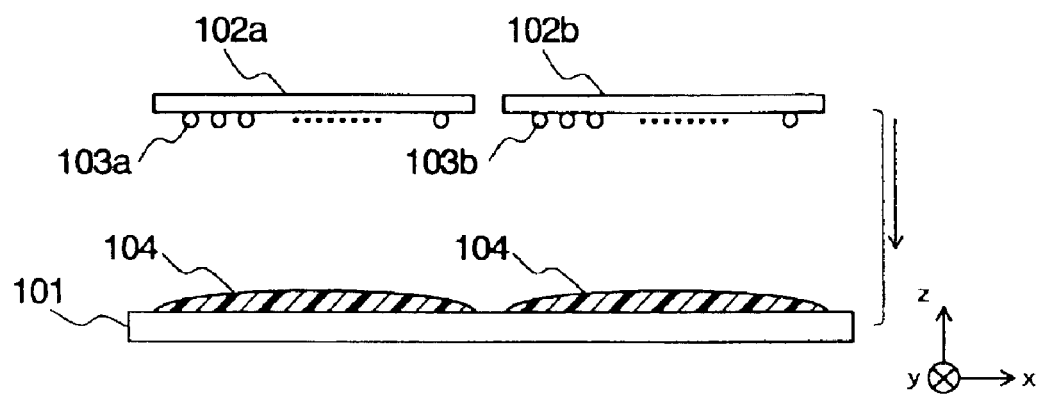
FIG. 8A to FIG. 8C are side views illustrating a conventional process for manufacturing a semiconductor device.
Figure 8B:
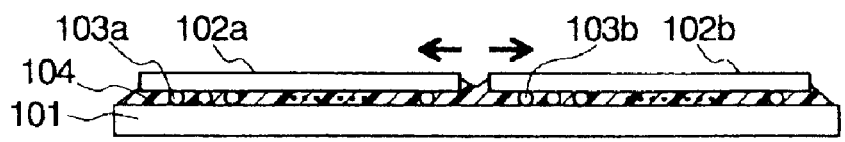
Figure 8C:
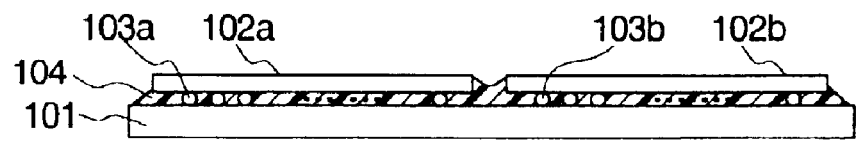

FIG. 7A and FIG. 7B are graphs showing the measured results of the mounting displacement of semiconductor chips when the resin filling factor in a gap between the semiconductor chips mounted adjacent to each other is varied. Here, the resin filling factor is defined as the ratio of a resin to a space domain, where the base thereof corresponds to an orthogonal projective plane on a wiring substrate by a gap between a semiconductor chip A and the other semiconductor chip B which is seen from an upper direction while the height thereof corresponds to the distance from a flip-chip bonding surface of the wiring substrate to one rear surface being not higher than the other rear surface between the rear surfaces of the semiconductor chip A and the semiconductor chip B relative to the wiring substrate.

FIG. 7A shows the measured results of the displacement in an x direction of both of the semiconductor chips A and B, while FIG. 7B shows the measured results of the displacement in a y direction of the same. The semiconductor chips A and B employed here have the dimension of 18.75 mm×4.55 mm and mounted with respective longer sides thereof being adjacent to each other and with a nominal gap therebetween being 0.5 mm. As shown in FIG. 7A and FIG. 7B, when the resin filling factor is approximately 60% or lower, the displacement is insignificant, but when it exceeds this value, the displacement increases sharply. The displacement of such an order becomes a serious cause for decrease in yield, particularly in the case of a flip-chip bonding terminal having a narrow pitch.

Judging from these results, therefore, reduction in the amount of the sealing resin (underfill resin) before curing which is applied on the wiring substrate can be considered in the design for narrowing the gap between the semiconductor chips A and B in order to prevent a great increase in the resin filling factor. However, the reduction in this amount results in a disadvantage in terms of reliability since the shape of the fillets formed along the sides other than the sides facing each other of the respective semiconductor chip A and the semiconductor chip B is not sufficient.

Here, FIG. 1A to FIG. 1E are sectional views schematically showing a manufacturing method of the semiconductor device according to the embodiment of the present invention. The process proceeds from FIG. 1A to FIG. 1E. In these drawings, the same reference symbols are used to designate the same portions.

First, as shown in FIG. 1A, a wiring substrate 11 (for example, several hundreds μm in thickness) in which necessary vertical electric conductors 12 and wiring patterns 13 are formed is prepared. The wiring patterns 13 include lands onto which semiconductor chips are to be flip-chip bonded. Though wiring patterns also exist on a surface, which is a lower one in the drawing, of the wiring substrate 11 to which the vertical electric conductors 12 are connected, they are omitted in the drawing.

A resin, a ceramics, a semiconductor (for example, a silicon), and so on can be used as a material of the wiring substrate 11. In the case of using, for example, a silicon as the material, a forming method of the vertical electric conductors 12 and the wiring patterns 13 is schematically described as follows. First, holes (non-through holes) are formed in portions where the vertical electric conductors 12 are to be formed, by selectively applying etching such as an RIE (reactive ion etching) method. Next, an insulating film is formed on an inner wall surface of each of these non-through holes and one of the surfaces of the substrate, and a barrier metal layer is further formed thereon.

Next, a seed layer made of, for example, copper is formed on the barrier metal layer, and a copper layer is grown on one surface of the substrate so as to fill the holes with copper by electrolytic plating with this seed layer used as a seed. Next, the copper layer and the barrier metal layer on the substrate are scraped off, for example, by a CMP (chemical mechanical polishing) method. Next, a patterned mask is formed on the substrate to form a wiring pattern by using this mask through the same successive processes, namely, forming of the barrier metal layer, forming of the seed layer, the electrolytic plating, and the CMP treatment. Further, the rear surface of the substrate is polished to expose the bottom part of the copper formed inside the holes from the rear surface of the substrate.

In the case where a semiconductor is used as the wiring substrate 11 in forming the wiring patterns 13 and the vertical electric conductors 12, the semiconductor manufacturing process can be thus employed so that a more microscopic pattern can be formed. This is suitable for the substrate for the flip-chip bonding of the semiconductor chips having a narrow terminal pitch.

Figure 1B:
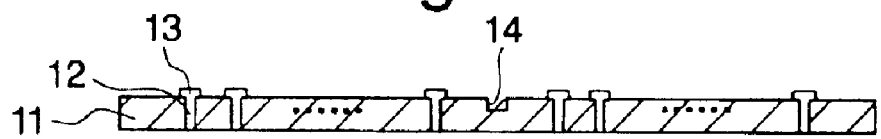

After the wiring substrate 11 on which the required vertical electric conductors 12 and the wiring patterns 13 are formed is prepared, a groove 14 as a concave is next formed on the wiring substrate 11, as shown in FIG. 1B. Various known processing technologies can be utilized in forming the groove 14 depending on the material to be used for the wiring substrate 11. For example, laser processing, chemical or physical etching, drilling, and so on are usable. Furthermore, in the case of using the semiconductor as the material of the wiring substrate 11, the groove 14 can also be formed by making an incision reaching halfway of the depth using a dicing apparatus. In the case of using the dicing apparatus, the incision can be made in advance at the same time when dicing is carried out to make a small piece as the wiring substrate 11.

Figure 1C:
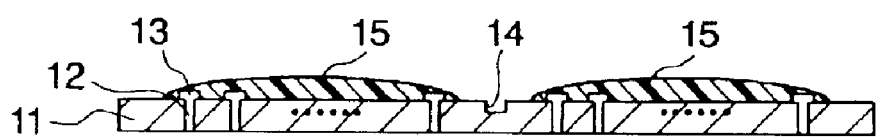

After the groove 14 is formed, a sealing resin (an underfill resin) 15 before curing is then supplied on the wiring substrate 11 evading the groove 14 by using, for example, a dispenser, as shown in FIG. 1C. The sealing resin 15 has a thermal curing property, and just before curing, it has a viscosity so that it retains a certain spread when it is applied on the wiring substrate 11. Incidentally, in the case where the flip-chip bonding to be carried out thereafter uses a solder, the use of a sealing resin having a flux ingredient as the sealing resin 15 is advantageous in surely obtaining mechanical and electrical connection by the solder since the wettability of the molten solder can easily be obtained.

Figure 1D:
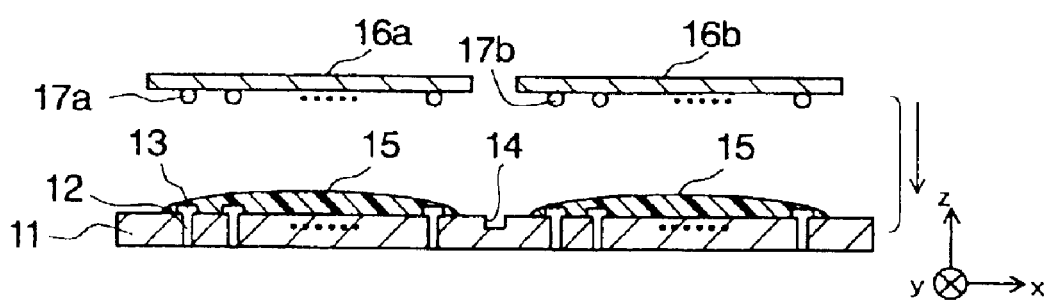

When the sealing resin 15 is supplied on the wiring substrate 11, the semiconductor chips 16a and 16b having external connection pads (not shown) on which solder bumps 17a and 17b are formed is then prepared, as shown in FIG. 1D. Then, the semiconductor chips 16a, 16b are kept apart from the wiring substrate 11 in a z direction and the semiconductor chips 16a and 16b are aligned relative to the wiring substrate 11 (x position, y position, and rotational position around a z axis). In order to form the solder bumps 17a and 17b on the pads of the semiconductor chips 16a and 16b, a known method, for example, mounting and melting of the solder ball can be employed.

Instead of forming the solder bumps 17a and 17b on the semiconductor chips 16a and 16b, for example, gold bumps may be formed thereon. Forming of the gold bumps can be carried out in such a manner that gold wires are connected onto the pads of the semiconductor chips 16a and 16b using, for example, a wire-bonding tool through a bonding technology, and then the gold wires are cut near at roots thereof.

Figure 1E:
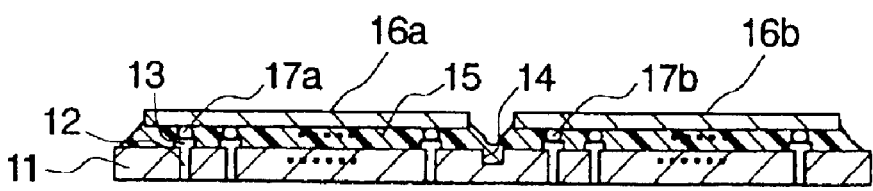

After the semiconductor chips 16a and 16b are aligned relative to the wiring substrate 11, the semiconductor chips 16a and 16b are next moved in the direction closer to the substrate 11 (z direction) to be pressed by, for example, a flip-chip bonder, and mounted and arranged so as to bring the solder bumps 17a and 17b into contact with the lands on the wiring substrate 11, as shown in FIG. 1E. As a result, the semiconductor chips 16a and 16b are temporarily fixed on the wiring substrate 11 with an adhesive power of the sealing resin 15. Such a mode of the temporary fixation is similarly applicable to a case where the gold bumps are formed on the semiconductor chips 16a and 16b.

At the time of the temporary fixation, the sealing resin 15 before curing is filled in a space between the semiconductor chip 16a and the wiring substrate 11 and a space between the semiconductor chip 16b and the wiring substrate 11, and squeezed out from these spaces so as to spread over the wiring substrate 11. However, in portions of the wiring substrate 11 adjacent to the gap between the semiconductor chip 16a and the semiconductor chip 16b, the squeezed out sealing resin 15 is received by the groove 14 so that the state in which the excessive sealing resin 15 exists in the gap is avoided. As a result, a force from the sealing resin 15 in the gap which works to push the semiconductor chip 16a and the semiconductor chip 16b away from each other is not exerted so that alignment accuracy of the semiconductor chips 16a and 16b is maintained.

While such alignment accuracy is maintained, the wiring substrate 11 on which the semiconductor chips 16a, 16b are temporarily fixed is then heated to melt the solder bumps 17a and 17b, thereby establishing mechanical and electrical connection between the semiconductor chips 16a and 16b and the substrate 11, and the sealing resin 15 is cured. Through such processes, the semiconductor device according to this embodiment can be obtained.

Incidentally, in the case of using the solder bumps 17a and 17b for the flip-chip bonding as described above, such an explanation is generally given that even when the temporarily fixed position is displaced to some degree, the alignment accuracy after re-curing of the solder is secured since a self-alignment effect works due to the surface tension during the solder melting. However, considering the property of the sealing resin 15, this explanation is not always true.

For example, there is a case where a melting point of the solder is 260° C. while the curing temperature of the sealing resin 15 ranges from 200° C. to 210° C. which is lower than the melting point of the solder. In such a case, when the temporarily fixed position is displaced, the electrical and mechanical connection by the solder melting is established thereafter while the displaced position is fixed due to the curing of the sealing resin 15. Therefore, the displacement after the temporary fixation directly results in decrease in yield. Even in such a case, this embodiment primarily clears away the possibility of the displacement after the temporary fixation so that the decrease in yield can be prevented.

Further, even when the flip-chip bonding is carried out not by a molten metal such as a solder but by a solid phase, for example, a gold bump, the force, which works to push the semiconductor chip 16a and the semiconductor chip 16b away from each other, from the sealing resin 15 in the gap therebetween is not exerted during the temporary fixation of the semiconductor chips 16a and 16b, in this embodiment similarly to the above description.

In the case of the solid bonding, a heat treatment such as annealing is generally carried out after the temporary fixation in order to secure a sufficient bonding strength. Therefore, when the bonding strength during the temporary fixation is weak and the groove 14 to receive the sealing resin 15 is not provided at all, the original state of bonding may not be maintained when the force of the sealing resin 15 in the gap between the semiconductor chips 16a and 16b is exerted thereon. This embodiment can meet such a case as well so that the decrease in yield can be prevented.

Further, when the material of the wiring substrate 11 and the material of the semiconductor chips 16a and 16b are different from each other, thermal expansion coefficients thereof are sometimes significantly different from each other so that a considerable stress is generated on the wiring substrate 11 in the vicinity of the gap between the semiconductor chip 16a and the semiconductor chip 16b due to the heat generation while in use. Such stress generation causes decrease in reliability such as a damage of the flip-chip bonding portion, but in this embodiment, since the groove 14 is provided at this portion, the stress generation is reduced. Therefore, improvement in reliability can be expected as well.

Figure 2:
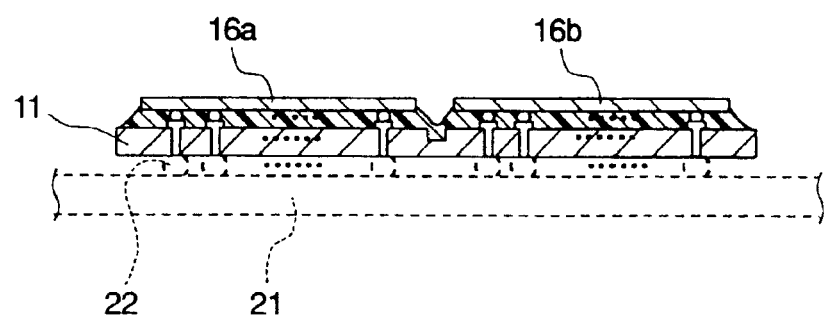
FIG. 2 is a sectional view schematically illustrating one mode of mounting a semiconductor device according to an embodiment of the present invention on a substrate.

FIG. 2 is a sectional view schematically illustrating one of the modes of mounting the semiconductor device according to this embodiment described above on a substrate. In FIG. 2, the same reference symbols are used to designate the portions described above.

In this mode, solder balls 22 are disposed on the reverse side of the surface of the wiring substrate 11 on which the semiconductor chips 16a and 16b are mounted, and the semiconductor device is mounted on a substrate 21 through the solder balls 22. In the semiconductor device used in such a mode, high density terminal arrangement such as BGA and LGA can be easily employed for arranging external connection terminals disposed on the surface of the wiring substrate 11 on which the solder balls 22 are mounted. Accordingly, this structure is suitable for high-density mounting.

Figure 3:
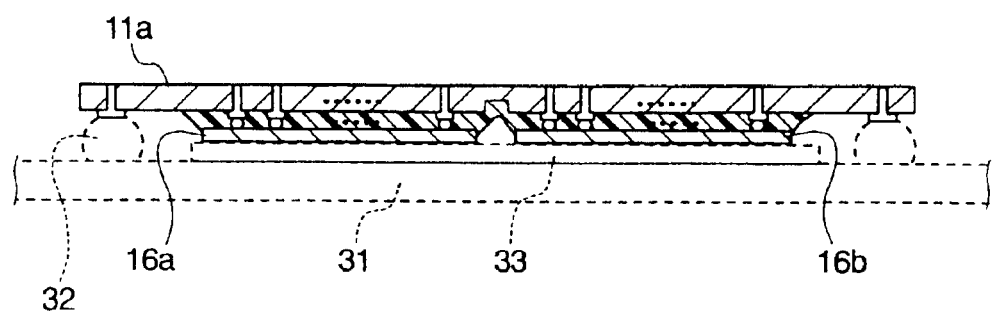
FIG. 3 is a sectional view schematically illustrating another mode, different from that shown in FIG. 2, of mounting a semiconductor device according to an embodiment of the present invention on a substrate.

FIG. 3 is a sectional view schematically illustrating another mode, different from that shown in FIG. 2, of mounting the semiconductor device according to the embodiment explained above on a substrate. In FIG. 3, the same reference symbols are used to designate the portions described above.

In this mode, solder balls 32 are disposed in portions near the circumference of the surface of the wiring substrate 11a same as the surface on which the semiconductor chips 16a and 16b are mounted, and the semiconductor device is mounted on a substrate 31 through the solder balls 32. Here, the reference symbol 33 denotes a spacer. In the semiconductor device used in this mode, it is possible to relatively freely draw a circuit pattern on the surface opposite the surface of the wiring substrate 11a on which the semiconductor chips 16a and 16b are mounted so that increase in an added value can be obtained through a combination of function, application, and so on of the semiconductor chips 16a and 16b. Furthermore, in the case where such a circuit is not required, a mode in which the vertical conductors are not formed in the wiring substrate 11a and the wiring patterns are formed only on the surface on which the flip-chip bonding is to be established may be employed to realize a low-cost mode.

Figure 4A:
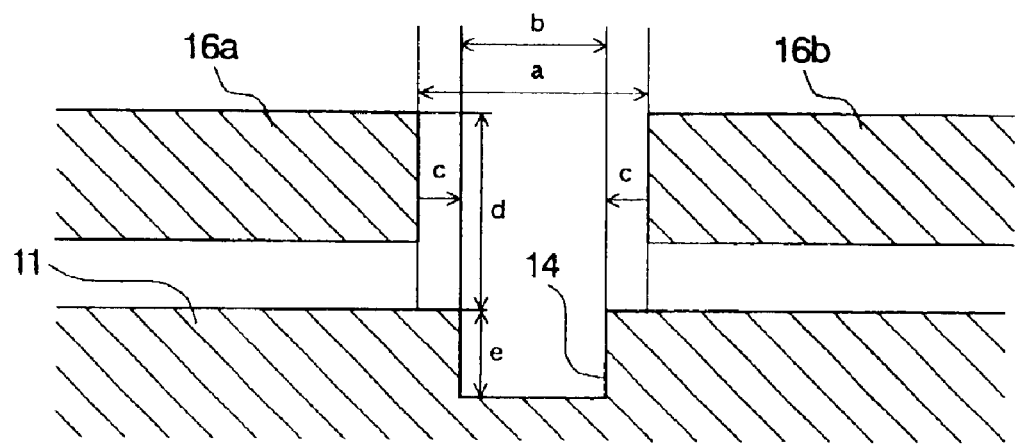
FIG. 4A and FIG. 4B are a sectional view and a top view respectively illustrating in detail a gap between a semiconductor chip 16a and a semiconductor chip 16b shown in FIG. 1E, and the shape of a wiring substrate 11 in the vicinity of the gap.
Figure 4B:
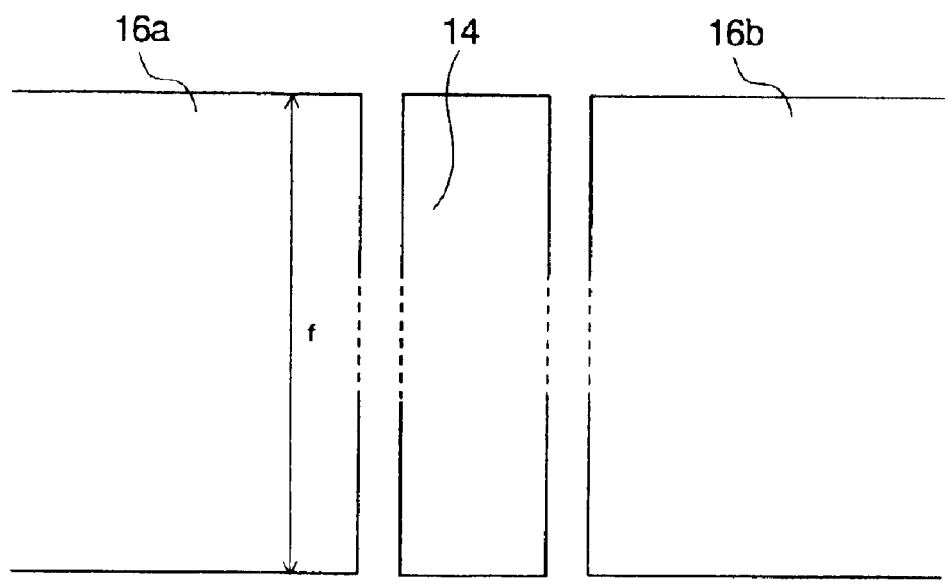

Next, a gap between the semiconductor chip 16a and the semiconductor chip 16b, and the shape of the wiring substrate 11 in the vicinity of the gap will be explained referring to FIG. 4A and FIG. 4B. FIG. 4A and FIG. 4B are a sectional view (FIG. 4A) and a top view (FIG. 4B) showing the gap between the semiconductor chip 16a and the semiconductor chip 16b and the shape of the wiring substrate 11 in the vicinity of the gap. In FIG. 4A and FIG. 4B, the same reference symbols are used to designate the portions explained above.

In FIG. 4A and FIG. 4B, an orthogonal projective plane on the wiring substrate 11 by the gap between the semiconductor chip 16a and the semiconductor chip 16b which is seen from an upper direction corresponds to a plane expressed as a×f. Furthermore, the distance from the flip-chip bonding surface of the wiring substrate 11 to one rear surface being not higher than the other rear surface between rear surfaces of the semiconductor chips 16a and the semiconductor 16b relative to the wiring substrate 11 is expressed as d. Here, it can be said from the results shown in FIG. 7A and FIG. 7B explained above that a filling factor of the sealing resin 15 in a space domain having a volume V=(a×f)×d is preferably 60% or lower.

In this embodiment, since the groove 14 having a length of f, a depth of e, and a width of b is formed, the sealing resin 15 can be received in the groove 14 even when a larger amount of the sealing resin 15 is squeezed out from the spaces between the semiconductor chips 16a and 16b and the wiring substrate 11. The outline of the explanation so far is that the filling factor can be accordingly decreased so that the force for causing the displacement of the semiconductor chips 16a and 16b is not generated.

Further, into the space domain, the aforesaid filling factor therein being an influential factor, the sealing resin 15 is supplied from the two facing semiconductor chips 16a and 16b sides, while normal fillets are formed by using almost the same amount of the sealing resin 15 as that of the supplied sealing resin 15 along the sides of the two semiconductor chips 16a and 16b opposite the aforesaid space domain. Therefore, as for these fillets, even when the filling factor of the sealing resin 15 in the space domain having the aforesaid volume V is controlled to be 60% or lower, the amount of the sealing resin corresponding to the capacity A (=(b×f)×e) of the groove 14 enables the fillets having a sufficient volume to be formed.

For example, it is possible to have the volume F satisfy the relationship expressed as 2F>0.6V, while the relationship among the volume F, the volume V, and the capacity A expressed as 2F−A≦0.6V is satisfied, where F represents the volume of each of the fillets formed along the not-shown sides having the length of f of the semiconductor chips 16a and 16b shown in FIG. 4A and FIG. 4B. Or, in the case where the heights of the rear surfaces of the semiconductor chips 16a and 16b are different from each other, and the volumes of the fillets formed along the not-shown sides having the length of f of the semiconductor chips 16a and 16b are F and Fa (F≠Fa) respectively, it is possible to obtain the relationship expressed as F+Fa>0.6V while satisfying the relationship expressed as (F+Fa)−A≦0.6V. Therefore, increase in reliability is achieved.

Here, it is basically preferable that the groove 14 is formed so as to be embraced in the orthogonal projective plane (a×f) on the wiring substrate 11 by the gap between the semiconductor chip 16a and the semiconductor chip 16b which is seen from an upper direction so that c shown in FIG. 4A becomes positive (or a becomes smaller than b), as shown in FIG. 4A and FIG. 4B. This is because this structure facilitates the formation of the fillets at a farther portion from the side surface of the semiconductor chip 16a (16b) in the gap between the semiconductor chip 16a and the semiconductor chip 16b.

When the dimension c is negative, portions just under the side surfaces of the semiconductor chips 16a and 16b are positioned inside the groove 14 so that it becomes difficult to form the fillets which reach the side surfaces. However, this can be said only when the gap between the semiconductor chips 16a and 16b is about 0.5 mm, and when the gap a narrows further, there may possibly be a case where the dimension c may be negative.

A sectional shape of the groove 14 may be a U-shape, a V-shape, or the like in addition to a rectangular shape as shown in FIG. 4A. Even when the sealing resin 15 has a low fluidity, these shapes enable the sealing resin 15 to be received more easily in the groove without any unfilled space left.

Figure 5A:
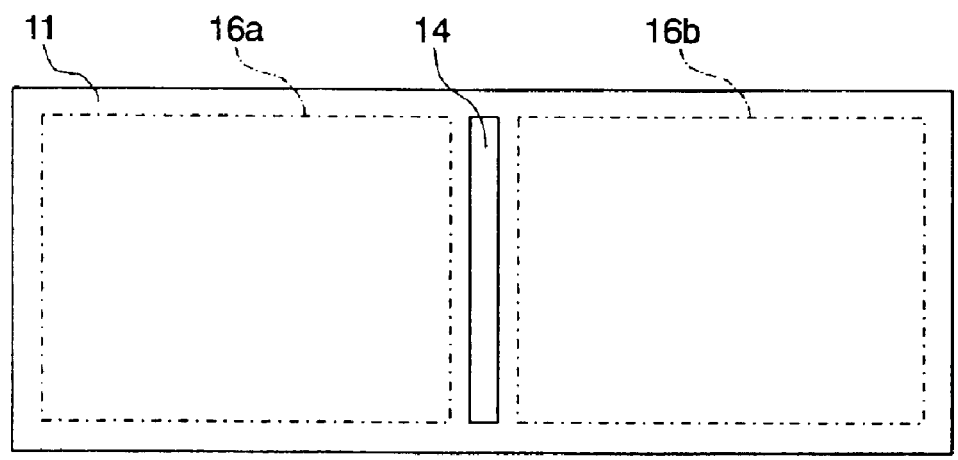
FIG. 5A and FIG. 5B are top views of the wiring substrate 11 illustrating other shape examples of a groove 14 shown in FIG. 1C to FIG. 1E.
Figure 5B:
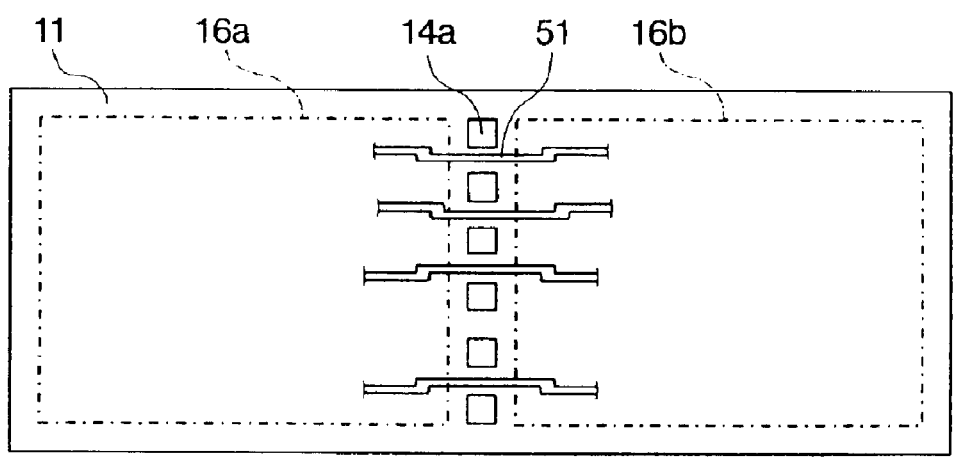

FIG. 5A and FIG. 5B are top views of the wiring substrate 11 to illustrate other shape examples of the groove 14. In FIG. 5A and FIG. 5B, the same reference symbols are used to designate the portions explained above. FIG. 5A corresponds to the example described so far, where the groove 14 having a long rectangular shape is formed between positions onto which the semiconductor chips 16a and 16b are bonded. In this case, a wiring pattern (not shown) mounted on the wiring substrate 11 is unavoidably divided by the groove 14. This greatly limits the number of wiring patterns which traverse between the semiconductor chips 16a and 16b.

In the example shown in FIG. 5B, a plurality of holes 14a are arranged in a line instead of the groove 14. These plural holes 14a are also capable of receiving the sealing resin 15 in the gap between the semiconductor chips 16a and 16b. Therefore, these holes 14a enable the decrease in the practical filling factor of the resin in this portion, and work to avoid the displacement of the temporary fixation of the semiconductor chips 16a and 16b.

Furthermore, the arrangement of the holes 14 makes it possible to have wirings 51 pass therebetween on the wiring substrate 11 so that many wirings connecting the semiconductor chips 16a and 16b can be disposed. As a result, an organic combination between the semiconductor chips 16a and 16b which are flip-chip bonded can have versatility so that an added value as a semiconductor device can be increased.

Incidentally, a plane shape of the holes 14a may be a circle, a polygon, an ellipse, or the like in addition to the rectangular shape as shown in the drawing. A sectional shape of the holes 14a may be a rectangular shape, a U-shape, a V-shape, or the like. As a forming method of the holes 14a, known methods can be employed depending on the material of the wiring substrate 11, similarly to the forming of the groove 14.

Figure 6:
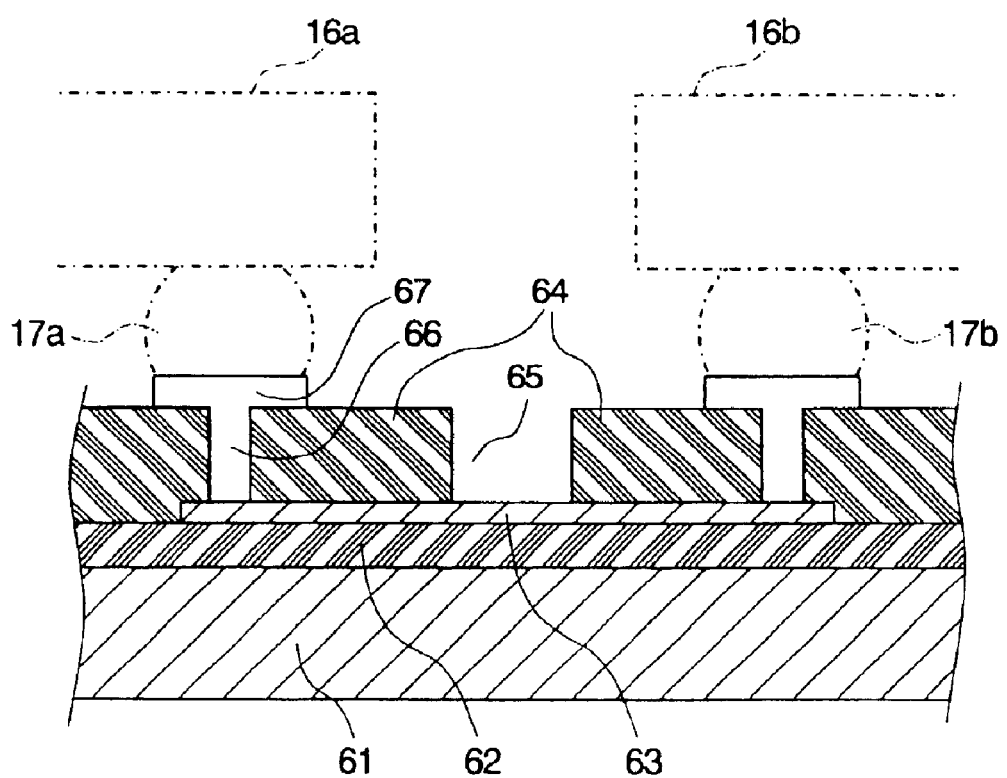
FIG. 6 is a sectional view schematically illustrating another example of the gap between the semiconductor chip 16a and the semiconductor chip 16b shown in FIG. 1E and the structure of the wiring substrate 11 in the vicinity of the gap.

FIG. 6 is a sectional view schematically illustrating another example of the gap between the semiconductor chip 16a and the semiconductor chip 16b and the structure of the wiring substrate 11 in the vicinity of the gap. In FIG. 6, the same reference symbols are used to designate the portions explained above. In this example, a groove 65 is formed, and many wiring patterns between the semiconductor chips 16a and the semiconductor chip 16b can be disposed without being divided by the groove 65.

In FIG. 6, an insulating layer 62 is first formed on a semiconductor substrate 61, and a wiring pattern 63 is formed in a required portion on the insulating layer 62. As shown in the drawing, the wiring pattern 63 is formed so as to be a part of the wiring patterns between the semiconductor chip 16a and the semiconductor chip 16b. The insulating layer 62 and the wiring pattern 63 can be formed by employing a known semiconductor manufacturing process.

Next, an insulating layer 64 is formed, for example, on the whole surface on which the insulating layer 62 and the wiring pattern 63 are formed so as to secure a relatively large thickness. Then, holes for vertical electric conductors 66 are formed by a selective method, for example, by RIE. Thereafter, as explained in FIG. 1A, the holes for the vertical electric conductors 66 undergo the processing for forming the vertical electric conductors 66, for example, by filling copper in these holes, and processing for forming wiring patterns 67 is further carried out. Thereafter, the groove 65 to receive the sealing resin therein is formed in the insulating layer 64 by a selective method, for example, by RIE. Through these processes, the structure shown in FIG. 6 can be obtained.

According to such a structure, the wiring pattern 63 can be freely arranged on/under the base of the groove 65 so that the wiring patterns which traverse between the semiconductor chips 16a and 16b are not divided by the groove 65. As a result, an organic combination between the semiconductor chips 16a and 16b which are flip-chip bonded can have versatility so that an added value as a semiconductor device can be increased.

It is to be understood that the present invention is not intended to be limited to the specific modes which are described here using the drawings, and all changes which come within the meaning and range of equivalency of the claims are intended to be embraced therein.

What is claimed is:

1. A semiconductor device comprising:
   a first semiconductor chip;
   a substrate onto which the first semiconductor chip is flip-chip bonded and on which a concave is formed along one side of the first semiconductor chip which is flip-chip bonded;
   a second semiconductor chip which is flip-chip bonded onto a portion on the substrate opposite the first semiconductor chip across the concave on the substrate; and
   a resin applied to a space between the substrate and the first semiconductor chip and a space between the substrate and the second semiconductor chip, a filling factor of the resin being 60% or lower in a space domain having a volume V, where a base thereof corresponds to an orthogonal projective plan on the substrate by a gap between the first semiconductor chip and the second semiconductor chip which is seen from an upper direction while a height thereof corresponds to a distance from a surface of the substrate onto which the flip-chip bonding is established to one rear surface being not higher than the other rear surface between rear surfaces of the first semiconductor chip and the second semiconductor chip relative to the substrate.

2. A semiconductor device as set forth in claim 1, wherein the concave on the substrate is formed in a groove-like shape along the one side of the first semiconductor chip.

3. A semiconductor device as set forth in claim 1, wherein the concave is formed as a plurality of holes arranged in a line along the one side of the first semiconductor chip.

4. A semiconductor device as set forth in claim 3, wherein the substrate has on a surface thereof a wiring running between the plural holes arranged in the line.

5. A semiconductor device as set forth in claim 1, wherein a plan form of the concave on the substrate is embraced in an orthogonal projective plane on the substrate by a gap between the first semiconductor chip and the second semiconductor chip which is seen from an upper direction.

6. A semiconductor device as set forth in claim 1, wherein relationship among F, A, and V is expressed as $2F-A \leq 0.6V$, where F represents a volume of a fillet which is formed of the resin applied to the space between the substrate and the first and second semiconductor chips and squeezed out from the space, and which is formed along a side having an equal length to that of the side along the concave, of the first or second semiconductor chip and being opposite to the side along the concave, A represents a capacity of the concave, and V represents the volume of the space domain.

7. A semiconductor device as set forth in claim 6, wherein relationship between the volume F and the volume V is expressed as 2F>0.6V.

8. A semiconductor device as set forth in claim 1, wherein relationship among F, Fa, A, and V is expressed as (F+Fa)−A≦0.6V, where F and Fa represent respectively a volume of fillets which are formed of the resin applied to the space between the substrate and the first and second semiconductor chips and squeezed out from the space, and each of which is formed along a side having a equal length to that of the side along the concave, of each of the first and second semiconductor chips and being opposite to the side along the concave, A represents a capacity of the concave, and V represents the volume of the space domain.

9. A semiconductor device as set forth in claim 8, wherein relationship between the volume F, the volume Fa, and the volume V is expressed F+Fa>0.6V.

10. A semiconductor device as set forth in claim 1, wherein the substrate is a resin as a material.

11. A semiconductor device as set forth in claim 1, wherein the substrate has a wiring on/under a base of the concave.

12. A semiconductor device as set forth in claim 1, wherein the first and second semiconductor chips are flip-chip bonded onto the substrate using a solder.

13. A semiconductor device as set forth in claim 1, wherein the substrate has a vertical electric conductor which establishes electrical connection between a surface onto which the first and second semiconductor chips are flip-chip bonded and a surface opposite this surface, and an external connection terminal which is disposed on the opposite surface and electrically conducting to the vertical electric conductor.

14. A semiconductor device as set forth in claim 1, wherein the first semiconductor chip and/or the second semiconductor chip is constituted as a memory chip.

15. A semiconductor device as set forth in claim 1, wherein the substrate is a semiconductor as a material.

16. A semiconductor device as set forth in claim 15, wherein the concave on the substrate is formed in a groove-like shape along the one side of the first semiconductor chip.

17. A semiconductor device as set forth in claim 15, wherein a plan form of the concave on the substrate is embraced in an orthogonal projective plane on the substrate by a gap between the first semiconductor chip and the second semiconductor chip which is seen from an upper direction.

18. A semiconductor device as set forth in claim 15, wherein the substrate has a wiring on/under a base of the concave.

19. A semiconductor device as set forth in claim 15, wherein the first and second semiconductor chips are flip-chip bonded onto the substrate using a solder.

20. A semiconductor device as set forth in claim 15, wherein the substrate has vertical electric conductor which establishes electrical connection between a surface onto which the first and second semiconductor chips are flip-chip bonded and a surface opposite the surface onto which the first and second semiconductor chips are flip chip bonded, and an external connection terminal which is disposed on the opposite surface and electrically conduction to the vertical electric conductor.

* * * * *

UNITED STATES PATENT AND TRADEMARK OFFICE
CERTIFICATE OF CORRECTION

PATENT NO.     : 6,946,741 B2
DATED          : September 20, 2005
INVENTOR(S)    : Yamashita It is certified that error appears in the above-identified patent and that said Letters Patent is hereby corrected as shown below:

Column 12,
Line 42, change "plan" to -- plane --.

Column 13,
Line 17, change "a equal" to -- an equal --.

Column 14,
Line 27, change "has vertical" to -- has a vertical --.
Line 31, change "flip chip" to -- flip-chip --.
Line 33, change "conduction" to -- conducting --.

Signed and Sealed this

Twenty-eighth Day of February, 2006

JON W. DUDAS
*Director of the United States Patent and Trademark Office*